(12) United States Patent
Lanzone

(10) Patent No.: US 8,564,114 B1
(45) Date of Patent: Oct. 22, 2013

(54) SEMICONDUCTOR PACKAGE THERMAL TAPE WINDOW FRAME FOR HEAT SINK ATTACHMENT

(75) Inventor: Robert Lanzone, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 450 days.

(21) Appl. No.: 12/730,062

(22) Filed: Mar. 23, 2010

(51) Int. Cl.
*H01L 23/48* (2006.01)
*H01L 23/495* (2006.01)
*H01L 23/34* (2006.01)
*H01L 29/80* (2006.01)
*H01L 31/112* (2006.01)

(52) U.S. Cl.
USPC ........... 257/693; 257/666; 257/677; 257/675; 257/276; 257/712

(58) Field of Classification Search
USPC ......... 257/693, 666, 667, 672, 675, 706, 717, 257/676, 677, 708, 712, 718, 720, 796, 276, 257/722
See application file for complete search history.

(56) References Cited

U.S. PATENT DOCUMENTS

| | | | |
|---|---|---|---|
| 5,744,863 A | 4/1998 | Culnane et al. | |
| 6,617,683 B2 | 9/2003 | Lebonheur et al. | |
| 7,566,591 B2 | 7/2009 | Zhao et al. | |
| 2006/0003483 A1* | 1/2006 | Wolff et al. | 438/65 |
| 2007/0034998 A1* | 2/2007 | Huang et al. | 257/678 |
| 2008/0315230 A1* | 12/2008 | Murayama | 257/98 |
| 2010/0193959 A1* | 8/2010 | Grygiel | 257/773 |

* cited by examiner

*Primary Examiner* — Chuong A. Luu

(57) ABSTRACT

The present invention is directed to a semiconductor packaging solution wherein a high K thermal material such as a grease or gel is placed in a controlled thin bond line between the semiconductor die of the package and a heat sink in a direct manner using a thermal tape window frame as a low cost mechanical attachment mechanism. As the main thermal dissipation path is between the backside of the semiconductor die and the heat sink, a high K TIM material can be used to maximize thermal dissipation in a manner that does not require expensive mechanical attachment methods.

19 Claims, 3 Drawing Sheets

SEMICONDUCTOR PACKAGE THERMAL TAPE WINDOW FRAME FOR HEAT SINK ATTACHMENT

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field of the Invention

The present invention relates generally to semiconductor packaging and, more particularly, to a semiconductor package provided with a thermal tape window frame which is adhered to the mold compound or package body of the semiconductor package and is adapted to provide both a low cost heat sink attachment and high dielectric constant (K) thermal solution.

2. Description of the Related Art

As is well known in the electronics field, semiconductor devices are often manufactured in package form, in which encapsulant materials or mold compounds provide environmental protection to the integrated circuit(s) or semiconductor die(s) of the semiconductor package. The mold compound, which ultimately hardens to form the package body of the semiconductor package, is exposed to heat generated by the semiconductor die(s) of the semiconductor package during the operation thereof. However, the encapsulant materials or mold compounds used to form the package body are typically plastics which are poor thermal dissipaters. In this regard, overheating of the semiconductor package can damage the semiconductor die(s) or other internal devices thereof, thus disrupting the operation of the semiconductor package and potentially causing dangerous electrical shorts. In order to minimize the risk of overheating, some semiconductor packages known in the art are provided with a heat sink or heat transfer system that conducts heat away from the internal semiconductor die(s) to the ambient environment.

One currently known semiconductor package widely used in various applications is referred to as a Flip Chip BGA or FCBGA package. Known sub-categories for FCBGA packages include Bare Die FCBGA packages, and Single Piece Lid (or SPL) FCBGA packages. In those FCBGA packages which are used in conjunction with a heat sink, the attachment of the heat sink thereto is typically facilitated through the use of one of two primary attachment methods. For high power applications, expensive mechanical attachment methods are used in conjunction with high K thermal interface materials (or TIM's). The mechanical attachment methods utilize machined or stamped fixtures that have springs, screws, clamps, latches or other physical devices to secure the heat sink to the FCBGA package. For low power applications, thermal tapes are used for the mechanical attachment of the heat sink to the FCBGA package, though the resultant thermal dissipation is limited.

More particularly, for Single Piece Lid or SPL FCBGA packages, the semiconductor die of such package has a TIM material between itself and the lid. This TIM material typically has a thin bond line and often comprises high K materials such as a grease or gel. For the heat sink attachment to the SPL FCBGA package, one of two primary methods is typically used, as indicated above. In a first one of such heat sink attachment methods, a strip of adhesive thermal tape having a lower K value is used, with such tape mechanically securing the heat sink to the SPL FCBGA package. Alternatively, for high power applications, a higher K TIM material is typically used to define the interface between the heat sink and the SPL FCBGA package, though the use of such higher K material requires the implementation of an additional step of securing the heat sink to the package. As also indicated above, such additional heat sink securing step typically entails some mechanical method such as the use of springs, screws, clamps, latches, etc. For Bare Die FCBGA packages, low K or high K TIM materials are used to facilitate the interface between the heat sink and such packages based on power dissipation requirements, though there still remains the need for a mechanical attachment method to secure the heat sink to the Bare Die FCBGA package.

Thus, as is apparent from the foregoing, there exists a need in the prior art for a packaging solution wherein a higher K TIM material may be used to facilitate the interface between a heat sink and a semiconductor package without requiring the further need for the implementation of a mechanical attachment method as described above. The present invention addresses this need by providing a semiconductor packaging solution wherein a high K thermal material such as a grease or gel is placed in a controlled thin bond line between the semiconductor die of the package and the heat sink in a direct manner using a thermal tape window frame as the low cost mechanical attachment mechanism. As the main thermal dissipation path is between the backside of the semiconductor die and the heat sink, a high K TIM material can be used to maximize thermal dissipation in a manner that does not require expensive mechanical attachment methods. These, as well as other features and advantages of the present invention, will be discussed in more detail below.

SUMMARY OF THE INVENTION

In accordance with the present invention, there is provided a packing solution for a semiconductor package, such as a FCBGA package, wherein a high K TIM material such as grease or gel is placed in a controlled thin bond line between the semiconductor die of the semiconductor package and a heat sink in a direct manner using a thermal tape window frame as a low cost mechanical attachment mechanism. The use of the thermal tape window frame in accordance with the present invention is particularly advantageous in relation to a further sub-category of FCBGA packages known as Flip Chip Molded Ball Grid Array or FCmBGA packages. In currently known FCmBGA packages, the flip chip semiconductor die thereof is over molded with mold compound which hardens into a package body. The package body is formed such that backside of the flip chip semiconductor die exposed therein and sits or protrudes a prescribed distance (e.g., about 50 μm's or microns) above the seating plane defined by the package body. The distance of protrusion can be modified to optimize the desired bond line of the TIM material which is ultimately applied to and covers the exposed potion of the semiconductor die.

As indicated above, the packaging solution of the present invention utilizes existing thermal tapes to create a window frame which defines an opening slightly exceeding the cross-sectional area of the exposed backside of the semiconductor die. The thermal tape window frame can be specified to a given thickness such that when attached to that surface of the package body defining the seating plane, the offset between the seating plane defined by the top surface of the thermal tape top window frame and the seating plane defined by the backside of the semiconductor die is predetermined to achieve a thin controlled bond line for a thermal grease or gel to be dispensed in the cavity collectively defined by the package body and the thermal tape window frame, the semiconductor die residing in such cavity. As the main thermal dissipation path is between the backside of the semiconductor die and the heat sink applied to the thermal tape window frame, a high K TIM material can be used to maximize thermal dissipation in a manner that does not require expensive mechanical attachment methods.

In an exemplary process flow implementing the packaging solution of the present invention, the thermal tape window frame is initially attached to the package body of an FCmBGA package such that the exposed backside of the semiconductor die resides within the window defined by the thermal tape window frame, i.e., resides in the cavity collectively defined by the thermal tape window frame and the package body. Thereafter, the cavity is filled with a high K thermal grease or gel to the approximate volume of such cavity. This material can be volumetrically dispensed to ensure that the cavity is filled to capacity without voids, thus resulting in a superior thermal interface. Thereafter, the heat sink is applied to the thermal tape window frame and adhered thereto, thus facilitating the attachment of the heat sink to the FCmBGA package. By way of further example, in the aforementioned process flow, the TIM material bond line can be controlled by using a thermal tape window frame having a thickness of about 100 μm's for an FCmBGA package where the semiconductor die sits approximately 50 μm's above the seating plane of the package body. Once mechanically attached, the resulting high K thermal grease or gel bond line thickness would be about 50 μm's.

The thermal tape window frame concept of the present invention can be applied to the above-described Bare Die FCBGA packages, in addition to the FCmBGA package configuration. When used in conjunction with Bare Die FCBGA packages, the thermal tape window frame would be thicker than that used in the FCmBGA packages such that the thickness of the thermal tape window frame would be approximately the thickness of the semiconductor die plus the desired bond line of the high K TIM material. By way of example, for a 300 mm full thickness die (about 775 μm's) where a 50 μm bond line is desired, the thermal tape window frame would have a thickness of about 825 μm's. For thinned die applications, the thickness of the thermal tape window frame could be modified to achieve the desired bond line thickness. As the thermal tape window frame is not the primary thermal conduction path, the thickness thereof is not the primary concern. Rather, the thermal tape window frame is primarily being used as the attachment medium and for setting the desired TIM material bond line thickness.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 2:
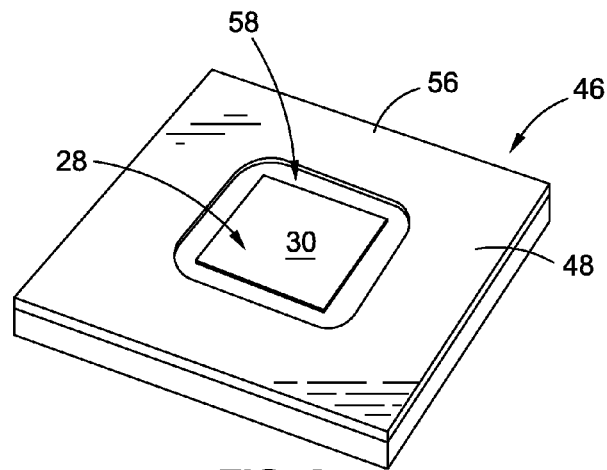
FIG. 2 is a top perspective view of the semiconductor package shown in FIG. 1, prior to the filling of a TIM material into the cavity of a thermal tape window frame of the semiconductor package.

Referring now to the drawings wherein the showings are for purposes of illustrating preferred embodiments of the present invention only, and not for purposes of limiting the same, FIGS. 1-5 depict a semiconductor package 10 constructed in accordance with a first embodiment of the present invention. The semiconductor package 10 comprises a base package 12. In the semiconductor package 10 shown in FIGS. 1-4, the base package 12 is an FCmBGA package. However, as will be discussed in more detail below, it is contemplated that other types of semiconductor devices or packages such as the above-described Bare Die FCBGA package may be substituted for an FCmBGA package to serve as the base package 12. More particularly, it is contemplated that base package 12 may comprise an FCmBGA package, an FCBGA package, a Flip Chip Chip Scale Package (or fcCSP package), or any other type of package having an exposed die, without departing from the spirit and scope of the invention.

Since, in the semiconductor package 10, the base package 12 comprises a conventional FCmBGA package, the description of the base package 12 will be limited to the major structural features thereof. In this regard, the base package 12 comprises a substrate 14 which, from the perspective shown in FIGS. 1 and 4, defines a generally planar top surface 16, and an opposed, generally planar bottom surface 18. The substrate 14, which preferably has a generally quadrangular (e.g., square) configuration, further defines a peripheral side surface 20 which extends generally perpendicularly between the top and bottom surfaces 16, 18.

Figure 1:
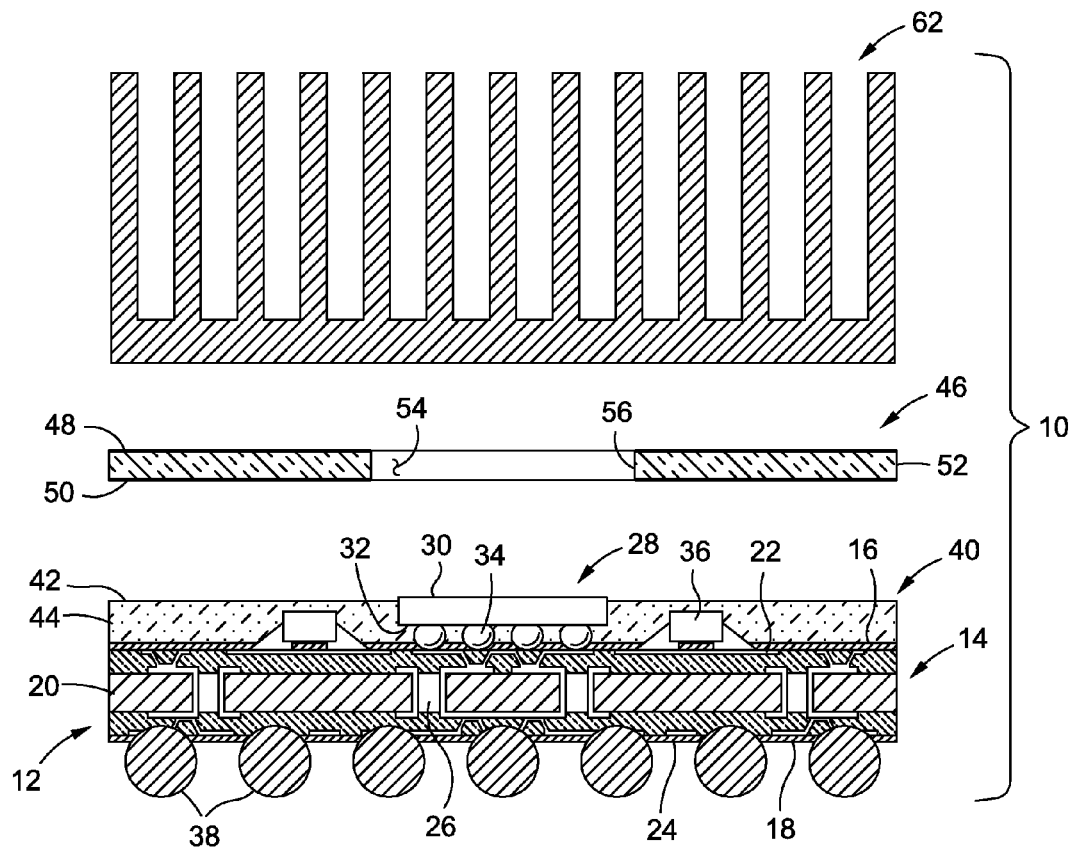
FIG. 1 is a side-elevational, exploded view of a semiconductor package constructed in accordance with a first embodiment of the present invention, further illustrating an exemplary heat sink which may be attached to such semiconductor package.

The substrate 14 further includes a conductive pattern 22 which is disposed on the top surface 16 thereof, and a conductive pattern 24 which is disposed on the bottom surface 18 thereof. The conductive patterns 22, 24 each preferably comprise conductive pads, terminals, traces, or combinations thereof. Additionally, the conductive patterns 22, 24 are electrically connected to each other in a prescribed arrangement through the use of conductive vias 26 which extend through the substrate 14. Those of ordinary skill in the art will recognize that the specific construction of the substrate 14 as shown in FIG. 1 is exemplary only, and may be varied without departing from the spirit and scope of the present invention.

The base package 12 further comprises a flip chip semiconductor die 28 which is electrically connected to a central portion of the conductive pattern 22. More particularly, when viewed from the perspective shown in FIGS. 1 and 4, the semiconductor die 28 defines a generally planar top surface 30 and an opposed, generally planar bottom surface 32. Disposed on the bottom surface 32 is a plurality of terminals which are electrically connected to prescribed parts of the central portion of a conductive pattern 22 through the use of respective ones of a plurality of solder balls 34. Like the substrate 14, the semiconductor die 28 typically has a generally quadrangular configuration.

In addition to the semiconductor die 28, the base package 12 includes one or more passive devices 36 which are also electrically connected to prescribed portions of the conductive pattern 22, and disposed adjacent to the semiconductor die 28. Whereas the semiconductor die 28 and passive devices 36 are electrically connected to prescribed portions of the conductive pattern 22, the conductive pattern 24 disposed on the bottom surface 18 of the substrate 14 preferably has a plurality of solder balls 38 electrically connected to prescribed portions thereof. The solder balls 38 are used to facilitate the electrical connection of the base package 12 to an underlying substrate such as a printed circuit board or PCB.

In the base package 12, an encapsulant material or mold compound is applied to the top surface 16 of the substrate 14 so as to cover the exposed portion thereof, to completely cover or encapsulate the passive device(s) 36, and to partially cover the semiconductor die 28. More particularly, in the base package 12, the encapsulant material or mold compound hardens into a package body 40 which, from the perspective shown in FIGS. 1 and 4, defines a generally planar top surface 42, and a side surface 44 which extends in generally flush relation to the side surface 20 of the substrate 14. In this regard, the package body 40, like the substrate 14, preferably has a generally quadrangular (e.g., square) configuration.

As indicated above, in the semiconductor package 10, the base package 12 is preferably an FCmBGA package. As a result, as also indicated above, the semiconductor die 28 of the base package 12 is not completely covered or encapsulated by the package body 40. Rather, as best seen in FIG. 1, a portion of the semiconductor die 28, including that portion defining the top surface 30 thereof, protrudes from the top surface 42 or seating plane defined by the package body 40. In the base package 12, the distance separating the seating plane defined by the top surface 30 of the semiconductor die 28 and the seating plane defined by the top surface 42 of the package body 40 is typically about 50 um's, though the amount of separation may vary based on the particular type of FCmBGA package used as the base package 12 in the semiconductor package 10. As also indicated above, the passive device(s) 36 included in the base package 12 do not protrude at all from the top surface 42 of the package body 40. Rather, the passive devices 36 are completely covered or encapsulated by the package body 40.

Figure 3:
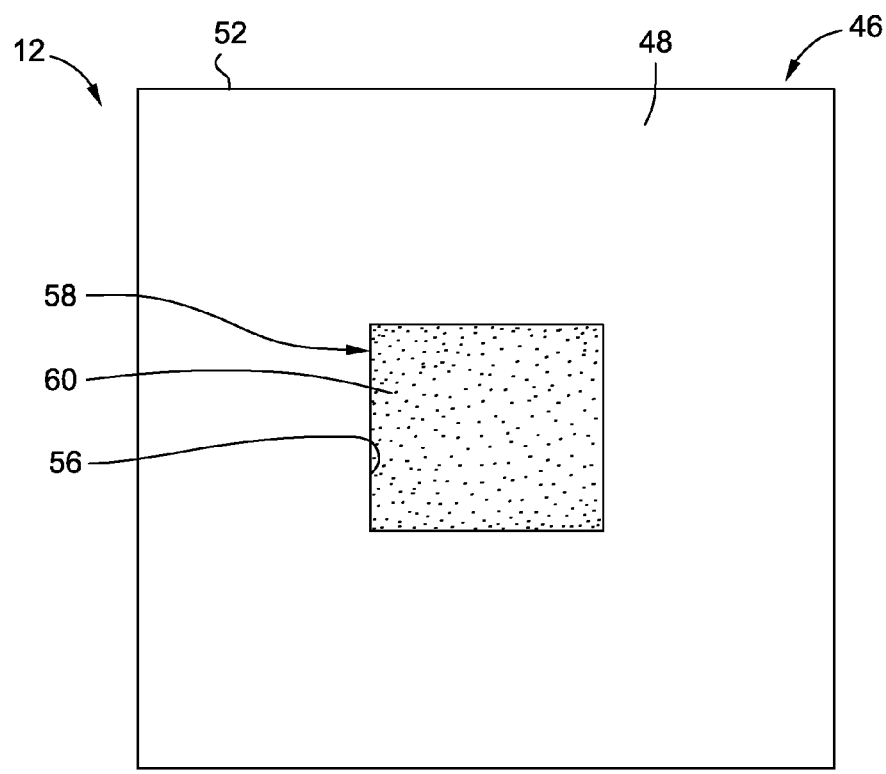
FIG. 3 is a top plan view of the semiconductor package of the first embodiment similar to FIG. 2, but depicting the cavity of the thermal tape window frame as being filled with a TIM material.

In addition to the base package 12, the semiconductor package 10 comprises a thermal tape window frame 46 which, for purposes of simplicity, will hereinafter be referred to as the frame 46. As best seen in FIGS. 2 and 3, the frame 46 has a generally quadrangular (e.g., square) configuration, the length and width dimensions of the frame 46 preferably being substantially equal to those of the package body 40. When viewed from the perspective shown in FIG. 1, the frame 46 defines a generally planar top surface 48, and an opposed, generally planar bottom surface 50. The frame 46 further defines an outer peripheral edge 52. In addition, the frame 46 defines a generally quadrangular (e.g., square) opening or window 54 within the approximate center thereof, the window 54 being defined by an inner peripheral edge 56 of the frame 46. As will be described in more detail below, the window 54 of the frame 46 is preferably sized to be of an area which slightly exceeds that of the top surface 30 of the semiconductor die 28 exposed in the package body 40 of the base package 12. Though not shown in FIG. 1, the bottom surface 50 of the frame 46 includes an adhesive layer applied thereto.

Figure 4:
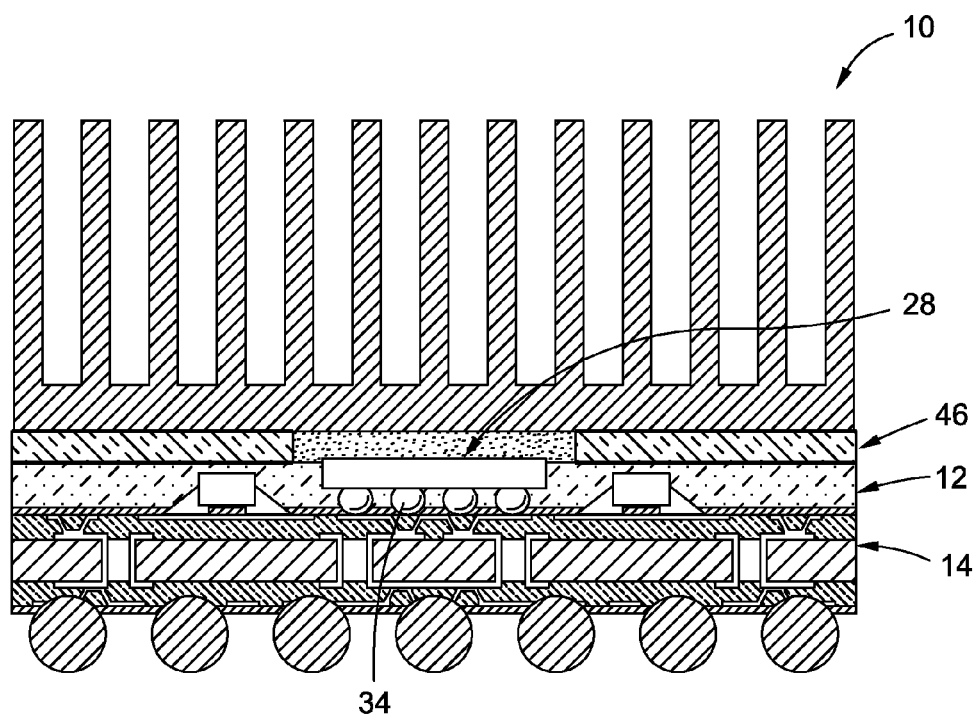
FIG. 4 is a side-elevational view of the semiconductor package of the first embodiment similar to FIG. 1, but depicting the semiconductor package in its fully assembled state inclusive of an exemplary heat sink.

As best seen in FIGS. 2 and 4, in the semiconductor package 10, the frame 46 is attached to the base package 12 such that the exposed portion of the semiconductor die 28 resides within the window 54 of the frame 46. More particularly, the adhesive coated bottom surface 50 of the frame 46 is secured to the top surface 42 of the package body 40, with the exposed portion of the semiconductor die 28 being aligned with the window 54 so as to be positioned therein in the aforementioned manner upon the adhesive engagement of the frame 46 to the package body 40. As indicated above, the length and width dimensions of the generally quadrangular frame 46 are preferably substantially equal to those of the generally quadrangular package body 40. As a result, when the frame 46 is properly secured to the package body 40, the outer peripheral edge 52 of the frame 46 is substantially flush with the side surface 44 of the package body 40 (and hence the side surface 20 of the substrate 14) in the manner best shown in FIG. 4.

As is also apparent from FIGS. 2 and 4, the thickness of the frame 46 between the top and bottom surfaces 48, 50 thereof is preferably selected so as to exceed by a prescribed distance or margin that distance at which the seating plane defined by the top surface 30 of the semiconductor die 28 is separated from or elevated above the seating plane defined by the top surface 42 of the package body 40. As indicated above, in the base package 12, the distance separating the seating plane defined by the top surface 30 of the semiconductor die 28 from seating plane defined by the top surface 42 of the package body 40 is preferably about 50 μm's. If, for example, the thickness of the frame 46 was about 100 μm's, the top surface 48 of the frame 46 would itself be separated from the seating plane defined by the top surface 30 of the semiconductor die 28 by a distance of about 50 μm's.

As is further seen in FIGS. 2 and 4, upon the attachment of the frame 46 to the base package 12 in the aforementioned manner, the window 54 of the frame 46 and a portion of the top surface 42 of the package body 40 collectively define a cavity 58, that portion of the semiconductor die 28 protruding from the package body 40 thus residing in such cavity 58. In the semiconductor package 10, the cavity 58 is preferably filled with a high K thermal grease or gel (i.e., a suitable TIM material) to the approximate volume thereof. It is contemplated that the TIM material may be volumetrically dispensed into the cavity 58 to ensure that the cavity 58 is completely filled without voids so as to eventually result in a superior thermal interface to another component of the semiconductor package 10 which will be described below. In FIG. 3, the cavity 58 is shown as being filled with a TIM material 60. As will be recognized, when the cavity 58 is completely filled in the aforementioned manner, the TIM material 60 completely covers the exposed portion of the semiconductor die 28 protruding from the package body 40 and residing within the cavity 58.

The frame 46 of the semiconductor package 10, in addition to including an adhesive layer applied to the bottom surface 50 thereof, further preferably includes an adhesive layer applied to the top surface 48 thereof. In this regard, as seen in FIGS. 1 and 4, the semiconductor package 10 further preferably comprises a heat sink 62 which is attached to the frame 46, and in particular to the adhesively coated top surface 48 thereof. As seen in FIG. 4, when the heat sink 62 is attached to the frame 46, the TIM material 60 filled into the cavity 58 is effectively captured or compressed between the heat sink 62 and the top surface 30 of the semiconductor die 28. Thus, the frame 46, in addition to facilitating the mechanical attachment of the heat sink 62 to the base package 12, serves the dual role of maintaining a substantially uniform thickness or controlled bond line of the TIM material 60 between the semiconductor die 28 and heat sink 62. In the examples given above wherein the seating plane defined by the top surface 30 of the semiconductor die 28 is spaced about 50 μm's above the seating plane defined by the top surface 42 of the package body 40, and the frame 48 has a thickness of about 100 μm's, the bond line of the TIM material 60 between the heat sink 62 and the top surface 30 of the semiconductor die 28 would itself have a thickness of about 50 μm's. However, those of ordinary skill in the art will recognize that the bond line thickness of the TIM material 60 may be varied in any desired manner based on variations in the thickness of the frame 46, and variations in the configuration of the base package 12, and in particular variations in the distance at which the seating plane defined by the top surface 30 of the semiconductor die 28 is separated from the seating plane defined by the top surface 42 of the package body 40. Those of ordinary skill in the art will further recognize that the structural attributes of the heat sink 62 as shown in FIGS. 1 and 4 is exemplary only, and may be varied without departing from the spirit and scope of the present invention. It is further contemplated that the frame 48 may be used to facilitate the attachment of the base package 12 to any type of heat dissipation structure other than for the heat sink 62 without departing from the spirit and scope of the present invention. It will further be recognized by those of ordinary skill in the art that the efficacy of the frame 48 in facilitating the attachment of the base package 12 to a heat dissipation structure is not diminished if the base package 12 is alternatively configured such that the seating plane defined by the top surface 30 of the semiconductor die 28 is substantially coplanar with or recessed relative to the seating plane defined by the top surface 42 of the package body 40, rather than protruding from and being elevated above the top surface 42.

Figure 5:
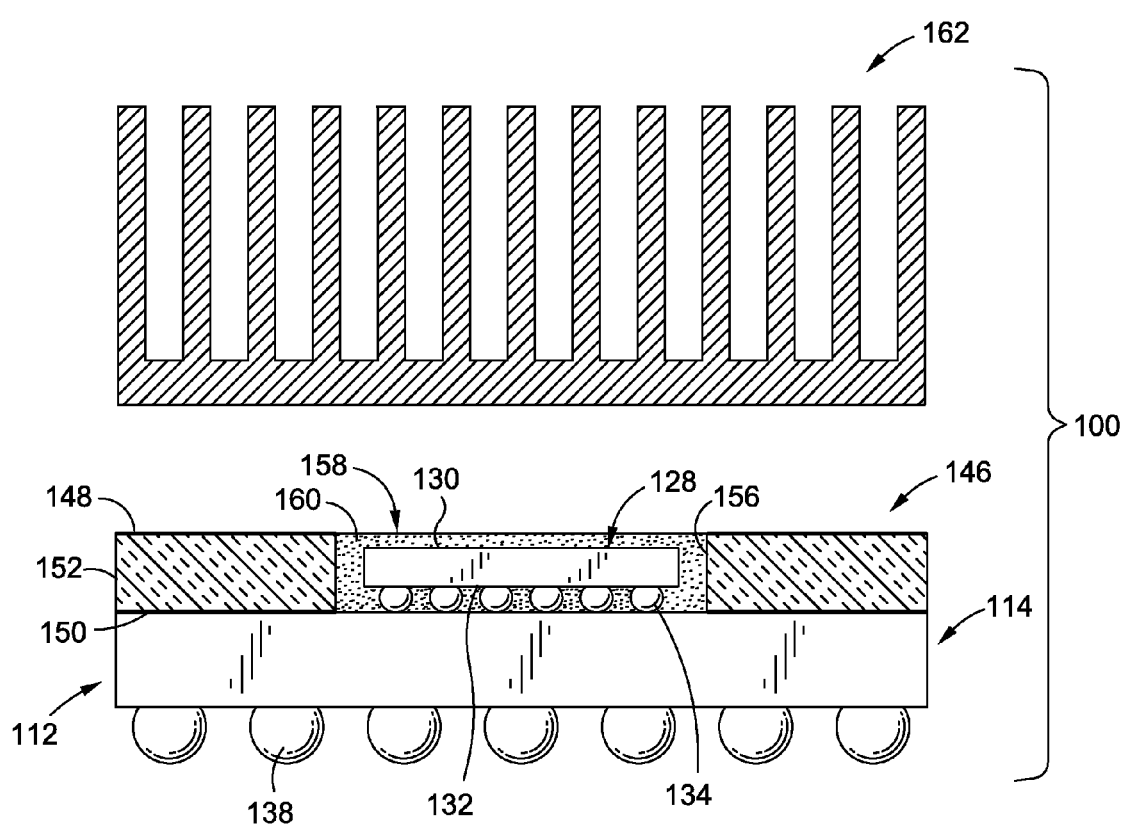
FIG. 5 is a side-elevational, exploded view of a semiconductor package constructed in accordance with a second embodiment of the present invention, further illustrating an exemplary heat sink which may be attached to such semiconductor package.

Referring now to FIG. 5, there is shown a semiconductor package 100 constructed in accordance with a second embodiment of the present invention. The semiconductor package 100 comprises a base package 112. In the semiconductor package 100 shown in FIG. 5 the base package 112 is a Bare Die FCBGA package. Thus, since in the semiconductor package 100 the base package 112 comprises a conventional Bare Die FCBGA package, the description of the base package 112 will be limited to the major structural features thereof. In this regard, the base package 112 comprises a substrate 114 which, from the perspective shown in FIG. 5, defines a generally planar top surface 116, and an opposed, generally planar bottom surface 118. The substrate 114, which preferably has a generally quadrangular (e.g., square) configuration, further defines a peripheral side surface 120 which extends generally perpendicularly between the top and bottom surfaces 116, 118.

The substrate 114 further includes a conductive pattern 122 which is disposed on the top surface 116 thereof, and a conductive pattern 124 which is disposed on the bottom surface 118 thereof. The conductive patterns 122, 124 each preferably comprise conductive pads, terminals, traces, or combinations thereof. Additionally, the conductive patterns 122, 124 are electrically connected to each other in a prescribed arrangement through the use of conductive vias 126 which extend through the substrate 114. Those of ordinary skill in the art will recognize that the specific construction of the substrate 114 as shown in FIG. 5 is exemplary only, and may be varied without departing from the spirit and scope of the present invention.

The base package 112 further comprises a flip chip semiconductor die 128 which is electrically connected to a central portion of the conductive pattern 122. More particularly, when viewed from the perspective shown in FIG. 5, the semiconductor die 128 defines a generally planar top surface 130 and an opposed, generally planar bottom surface 132. Disposed on the bottom surface 132 is a plurality of terminals which are electrically connected to prescribed parts of the central portion of a conductive pattern 122 through the use of respective ones of a plurality of solder balls 134. Like the substrate 114, the semiconductor die 128 typically has a generally quadrangular configuration. The conductive pattern 124 disposed on the bottom surface 118 of the substrate 114 preferably has a plurality of solder balls 138 electrically connected to prescribed portions thereof. The solder balls 138 are used to facilitate the electrical connection of the base package 112 to an underlying substrate such as a printed circuit board or PCB.

In addition to the base package 112, the semiconductor package 100 comprises a thermal tape window frame 146 which, for purposes of simplicity, will hereinafter be referred to as the frame 146. The frame 146 has a generally quadrangular (e.g., square) configuration, the length and width dimensions of the frame 146 preferably being substantially equal to those of the substrate 114. When viewed from the perspective shown in FIG. 5, the frame 146 defines a generally planar top surface 148, and an opposed, generally planar bottom surface 150. The frame 146 further defines an outer peripheral edge 152. In addition, the frame 146 defines a generally quadrangular (e.g., square) opening or window 154 within the approximate center thereof, the window 154 being defined by an inner peripheral edge 156 of the frame 146. As will be described in more detail below, the window 154 of the frame 146 is preferably sized to be of an area which slightly exceeds that of the top surface 130 of the semiconductor die 128. Though not shown in FIG. 5, the bottom surface 150 of the frame 146 includes an adhesive layer applied thereto.

In the semiconductor package 100, the frame 146 is attached to the base package 112 such that the exposed portion of the semiconductor die 128 resides within the window 154 of the frame 146. More particularly, the adhesive coated bottom surface 150 of the frame 146 is secured to a portion of the top surface 116 of the substrate 114, with the semiconductor die 128 being aligned with the window 154 so as to be positioned therein in the aforementioned manner upon the adhesive engagement of the frame 146 to the base package 112. As indicated above, the length and width dimensions of the generally quadrangular frame 146 are preferably substantially equal to those of the generally quadrangular substrate 114. As a result, when the frame 146 is properly secured to the substrate 114, the outer peripheral edge 152 of the frame 146 is substantially flush with the side surface 120 of the substrate 114.

As is also apparent from FIG. 5, the thickness of the frame 146 between the top and bottom surfaces 148, 150 thereof is preferably selected so as to exceed by a prescribed distance or margin that distance at which the seating plane defined by the top surface 130 of the semiconductor die 128 is separated from or elevated above the top surface 116 of the substrate 114. In the base package 112, the distance separating the seating plane defined by the top surface 130 of the semiconductor die 128 from the top surface 116 of the substrate 114 is typically about 775 μm's (for a 300 mm full thickness semiconductor die 128). If, for example, the thickness of the frame 146 was about 825 μm's, the top surface 148 of the frame 146 would itself be separated from the seating plane defined by the top surface 130 of the semiconductor die 128 by a distance of about 50 μm's.

As is further seen in FIG. 5, upon the attachment of the frame 146 to the base package 112 in the aforementioned manner, the window 154 of the frame 146 and a portion of the top surface 116 of the substrate 114 collectively define a cavity 158, the semiconductor die 128 thus residing in such cavity 158. In the semiconductor package 100, the cavity 158 is preferably filled with a high K thermal grease or gel (i.e., a suitable TIM material) to the approximate volume thereof. It is contemplated that the TIM material may be volumetrically dispensed into the cavity 158 to ensure that the cavity 158 is completely filled without voids so as to eventually result in a superior thermal interface to another component of the semiconductor package 100 which will be described below. In FIG. 5, the cavity 158 is shown as being filled with a TIM material 160. As will be recognized, when the cavity 158 is completely filled in the aforementioned manner, the TIM material 160 completely covers the semiconductor die 128 residing within the cavity 158.

The frame 146 of the semiconductor package 100, in addition to including an adhesive layer applied to the bottom surface 150 thereof, further preferably includes an adhesive layer applied to the top surface 148 thereof. In this regard, the semiconductor package 100 further preferably comprises a heat sink 162 which is attached to the frame 146, and in particular to the adhesively coated top surface 148 thereof. When the heat sink 162 is attached to the frame 146, the TIM material 160 filled into the cavity 158 is effectively captured or compressed between the heat sink 162 and the top surface 130 of the semiconductor die 128. Thus, the frame 146, in addition to facilitating the mechanical attachment of the heat sink 162 to the base package 112, serves the dual role of maintaining a substantially uniform thickness or controlled bond line of the TIM material 160 between the semiconductor die 128 and heat sink 162. In the examples given above wherein the seating plane defined by the top surface 130 of the semiconductor die 28 is spaced about 775 μm's above the top surface 116 of the substrate 114, and the frame 148 has a thickness of about 825 μm's, the bond line of the TIM material 160 between the heat sink 162 and the top surface 130 of the semiconductor die 128 would itself have a thickness of about 50 μm's. However, those of ordinary skill in the art will recognize that the bond line thickness of the TIM material 160 may be varied in any desired manner based on variations in the thickness of the frame 146, and variations in the configuration of the base package 112, and in particular variations in the distance at which the seating plane defined by the top surface 130 of the semiconductor die 128 is separated from the top surface 116 of the substrate 114. Those of ordinary skill in the art will further recognize that the structural attributes of the heat sink 162 as shown in FIG. 5 is exemplary only, and may be varied without departing from the spirit and scope of the present invention.

Thus, based on the foregoing, the present invention provides a semiconductor packaging solution wherein the high K TIM material 60, 160 is placed in a controlled thin bond line between the semiconductor die 28, 128 and the heat sink 62, 162 in a direct manner using the frame 46, 146 as a low cost mechanical attachment mechanism. As the main thermal dissipation path is between the top surface 30, 130 of the semiconductor die 28, 128 and the heat sink 62, 162, the high K TIM material 60, 160 can be used to maximize thermal dissipation in a manner that does not require expensive mechanical attachment methods.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a base package which includes a package body defining a body seating plane, and at least one semiconductor die which is partially encapsulated by the package body, the semiconductor die having a portion which protrudes from the package body and defines a die seating plane which is spaced from the body seating plane by a first prescribed distance; and
   a frame defining opposed top and bottom surfaces and a window which extends between the top and bottom surfaces, the frame being attached to the base package such that the window and the package body collectively define a cavity in which the portion of the semiconductor die protruding from the package body resides;
   the frame having a thickness between the top and bottom surfaces thereof which is selected such that the top surface of the frame is spaced from the die seating plane by a second prescribed distance.

2. The semiconductor package of claim 1 wherein the frame is formed from a layer of thermal tape.

3. The semiconductor package of claim 1 wherein the cavity is filled with a high K thermal interface material which completely covers the portion of the semiconductor die protruding from the package body and defining the die seating plane.

4. The semiconductor package of claim 3 further in combination with a heat sink which is attached to the frame in a manner wherein the thermal interface material defines a bond line between the heat sink and the die seating plane of the semiconductor die which is of a bond line thickness substantially equal to the second prescribed distance.

5. The semiconductor package of claim 4 wherein:
   the bottom surface of the frame includes an adhesive layer applied thereto which is secured to the body seating plane defined by the package body; and
   the top surface of the frame includes an adhesive layer applied thereto which is secured to the heat sink.

6. The semiconductor package of claim 5 wherein the frame is formed from a layer of thermal tape.

7. The semiconductor package of claim 1 wherein the base package is an FCmBGA package.

8. The semiconductor package of claim 1 wherein the first prescribed distance and the second prescribed distance are substantially equal to each other.

9. A semiconductor package, comprising:
   a base package comprising a substrate defining a top surface and at least one semiconductor die electrically connected to the substrate and defining a die seating plane which is spaced from the top surface of the substrate by a first prescribed distance; and
   a frame defining opposed top and bottom surfaces and a window which extends between the top and bottom surfaces, the frame being attached to the base package such that the window and the substrate collectively define a cavity in which the semiconductor die resides, the cavity being filled with a high K thermal interface material which completely covers the semiconductor die;

the frame having a thickness between the top and bottom surfaces thereof which is selected such that the top surface of the frame is spaced from the die seating plane by a second prescribed distance.

10. The semiconductor package of claim 9 wherein the frame is formed from a layer of thermal tape.

11. The semiconductor package of claim 9 further in combination with a heat sink which is attached to the frame in a manner wherein the thermal interface material defines a bond line between the heat sink and the die seating plane of the semiconductor die which is of a bond line thickness substantially equal to the second prescribed distance.

12. The semiconductor package of claim 11 wherein:
the bottom surface of the frame includes an adhesive layer applied thereto which is secured to the top surface defined by the substrate; and
the top surface of the frame includes an adhesive layer applied thereto which is secured to the heat sink.

13. The semiconductor package of claim 12 wherein the frame is formed from a layer of thermal tape.

14. The semiconductor package of claim 9 wherein the base package is a Bare Die FCBGA package.

15. The semiconductor package of claim 9 wherein the first prescribed distance exceeds the second prescribed distance.

16. A semiconductor package, comprising:
a base package comprising a substrate and at least one semiconductor die electrically connected to the substrate and defining a die seating plane;
a frame defining opposed top and bottom surfaces and a window which extends between the top and bottom surfaces, the frame being attached to the base package such that the window and the substrate collectively define a cavity in which the semiconductor die resides, the frame having a thickness between the top and bottom surfaces thereof which is selected such that the top surface of the frame is spaced from the die seating plane by a prescribed distance, with the cavity being filled with a thermal interface material which covers the semiconductor die; and
a heat sink which is attached to the frame in a manner wherein the thermal interface material defines a bond line between the heat sink and the die seating plane of the semiconductor die which is of a bond line thickness substantially equal to the prescribed distance.

17. The semiconductor package of claim 16 wherein:
the bottom surface of the frame includes an adhesive layer applied thereto which is secured to the substrate; and
the top surface of the frame includes an adhesive layer applied thereto which is secured to the heat sink.

18. The semiconductor package of claim 17 wherein the frame is formed from a layer of thermal tape.

19. The semiconductor package of claim 16 wherein the base package is selected from one of an FCmBGA package and a Bare Die FCBGA package.

\* \* \* \* \*